(12) United States Patent
Ruth et al.

(10) Patent No.: US 12,160,558 B2
(45) Date of Patent: *Dec. 3, 2024

(54) SIGNAL LEAKAGE MONITORING BASED QUALITY CONTROL

(71) Applicant: VIAVI SOLUTIONS INC., Chandler, AZ (US)

(72) Inventors: Alvin R. Ruth, Indianapolis, IN (US); Raleigh Benton Stelle, IV, Indianapolis, IN (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/113,336

(22) Filed: Feb. 23, 2023

(65) Prior Publication Data
US 2023/0283765 A1    Sep. 7, 2023

Related U.S. Application Data

(63) Continuation of application No. 16/846,016, filed on Apr. 10, 2020, now Pat. No. 11,611,740.

(51) Int. Cl.
| | |
|---|---|
| *H04N 17/00* | (2006.01) |
| *G01R 31/08* | (2020.01) |
| *G06Q 10/063* | (2023.01) |

(52) U.S. Cl.
CPC ........... *H04N 17/00* (2013.01); *G01R 31/083* (2013.01); *G06Q 10/063* (2013.01)

(58) Field of Classification Search
CPC .. G01R 29/0814; G01R 31/083; H04N 17/00; G06Q 10/063
See application file for complete search history.

(56) References Cited

U.S. PATENT DOCUMENTS

| | | | | |
|---|---|---|---|---|
| 6,005,518 A | * | 12/1999 | Kallina | ............... G01R 29/0814 379/22 |
| 9,021,539 B2 | | 4/2015 | Stelle, IV | |
| 9,179,337 B2 | | 11/2015 | Zinevich | |
| 2012/0116697 A1 | * | 5/2012 | Stelle, IV | ............... H04N 17/00 702/59 |

(Continued)

FOREIGN PATENT DOCUMENTS

| | | | | |
|---|---|---|---|---|
| CN | 108443714 A | * | 8/2018 | ............... G17D 5/02 |

*Primary Examiner* — Michael J Dalbo
*Assistant Examiner* — Kaleria Knox
(74) *Attorney, Agent, or Firm* — Mannava & Kang, P.C.

(57) ABSTRACT

In some examples, signal leakage monitoring based quality control may include measuring, by a signal leakage level detector, for a signal leak at a specified location, a signal leakage level. The signal leak may include a status of being open. A geo-location value and a time value associated with the measurement of the signal leakage level may be assigned to the signal leakage level. A signal leakage closure quality analyzer may transmit the signal leakage level, the geo-location value, and the time value to a signal leakage analyzer. Further, the signal leakage closure quality analyzer may receive, from the signal leakage analyzer and based on an analysis of the signal leakage level, the geo-location value, and the time value by the signal leakage analyzer, an indication that the status of the signal leak is changed from being open to closed, or the status of the signal leak remains open.

18 Claims, 6 Drawing Sheets

(56) References Cited

U.S. PATENT DOCUMENTS

2017/0254721 A1* 9/2017 Casari ................. F02D 41/3809
2018/0106197 A1* 4/2018 Harper .................... F02C 9/263
2019/0113414 A1* 4/2019 Tsuzuki ................. G01M 3/04

* cited by examiner

500

MEASURE, BY A SIGNAL LEVEL DETECTOR, FOR A SIGNAL LEAK AT A SPECIFIED LOCATION, A SIGNAL LEAKAGE LEVEL
502

TRANSMIT, BY THE SIGNAL LEVEL DETECTOR, THE SIGNAL LEAKAGE LEVEL TO A SIGNAL LEAKAGE ANALYZER
504

RECEIVE, FROM THE SIGNAL LEAKAGE ANALYZER AND BASED ON AN ANALYSIS OF THE SIGNAL LEAKAGE LEVEL BY THE SIGNAL LEAKAGE ANALYZER, AN INDICATION TO MAINTAIN OR CHANGE THE SPECIFIED STATUS OF THE SIGNAL LEAK
506

*FIG. 5*

SIGNAL LEAKAGE MONITORING BASED QUALITY CONTROL

CROSS REFERENCE TO RELATED APPLICATIONS

This patent application is a Continuation of commonly assigned and co-pending U.S. patent application Ser. No. 16/846,016, filed on Apr. 10, 2020, the disclosure of which is hereby incorporated by reference in its entirety.

BACKGROUND

With respect to leakage testing of a network, such as a coaxial network and other such networks, a device, such as a leakage transmitter, may be utilized to generate test signals, and a leakage receiver may identify leakage points in the network. Once a leakage point is identified, a technician may perform remedial actions, such as, replacing and/or otherwise servicing part(s) of the network that are identified as including the leak.

BRIEF DESCRIPTION OF DRAWINGS

Features of the present disclosure are illustrated by way of example and not limited in the following figure(s), in which like numerals indicate like elements, in which:

FIG. 5 illustrates a flowchart of an example method for signal leakage monitoring based quality control in accordance with an example of the present disclosure.

DETAILED DESCRIPTION

Figure 1:
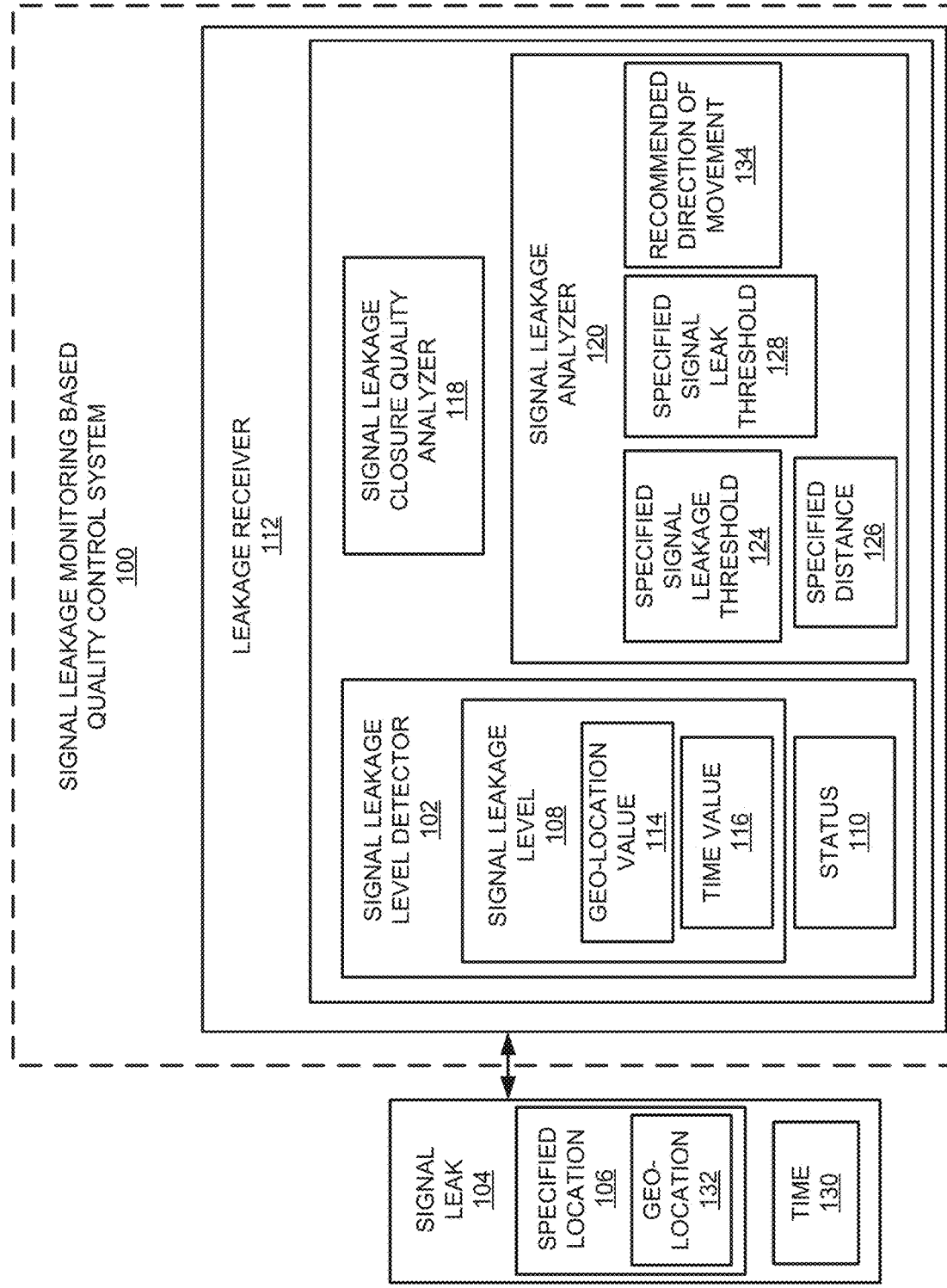
FIG. 1 illustrates an architectural layout of a signal leakage monitoring based quality control system in accordance with an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Signal leakage monitoring based quality control systems, methods for signal leakage monitoring based quality control, and non-transitory computer readable media for signal leakage monitoring based quality control are disclosed herein. The systems, methods, and non-transitory computer readable media disclosed herein provide for validation, and implementation of additional actions if needed, for a repair associated with a signal leak. In this regard, the systems, methods, and non-transitory computer readable media disclosed herein provide for updating of a signal leakage level in a leakage database or another such environment. An example of a leakage database may include a Leakage Analysis Workshop (LAW®) from Viavi™. In this regard, once a signal leakage level is measured for a signal leak that has been presumably addressed (e.g., by remedial actions as disclosed herein), the signal leakage level may be compared to a specified signal leakage threshold to determine whether the signal leak should remain open (e.g., where the signal leak is considered an active or unresolved signal leak) or whether the signal leak should be closed (e.g., where the signal leak is considered an inactive or resolved signal leak). If the specified signal leakage threshold is met, the signal leak may be closed, for example, in the leakage database.

With respect to leakage testing of a network, such as a coaxial network and other such networks, a device, such as a leakage transmitter, may be utilized to generate test signals, and a leakage receiver may identify leakage points in the network. Examples of leakage transmitters may include the CT-4™ or CT-X™ by Viavi™. Once a leakage point is identified, a technician may perform remedial actions, such as, replacing and/or otherwise servicing part(s) of the network that are identified as including the leak. In this regard, it is technically challenging for the technician to substantiate in near-real time the quality of the remedial actions taken that validate the closure of the signal leak. For example, if the signal leak is not properly remedied but closed anyway, a technician may need to re-visit the leak site to perform further remedial actions. The leakage point may also need to be identified again before remedial action can occur, further delaying the closing of signal leaks. These duplicate efforts may add challenges to both the operational process and closing of signal leaks.

In order to address at least the aforementioned technical challenges, the systems, methods, and non-transitory computer readable media disclosed herein provide for initiating of a quality control procedure at a leakage receiver. Examples of leakage receivers may include Seeker D™, Seeker X™, and other such leakage receivers by Viavi™. The quality control procedure may be initiated by measurement of a signal leakage level for a signal leak at a specified location. This signal leakage level may be combined with a geo-location value and a time value measured by the leakage receiver, or by another device, such as a MCA III™ by Viavi™. The combined signal leakage level, geo-location value, and time value may be sent to a signal leakage analyzer to determine whether the technician was at the correct signal leak location and whether the signal leak is to remain open, or whether a status of the signal leak is to be changed from open to closed. The signal leakage analyzer may be provided as a component of the leakage receiver, or in an analysis server. An example of the analysis server includes a leakage database such as the Leakage Analysis Workshop (LAW™) from Viavi™. The assessment by the signal leakage analyzer to open or close the signal leak may effectively provide a quality control check (or an audit, or validation) to ascertain the quality of remedial actions to close a signal leak.

For the systems, methods, and non-transitory computer readable media disclosed herein, the elements of the systems, methods, and non-transitory computer readable media disclosed herein may be any combination of hardware and programming to implement the functionalities of the respective elements. In some examples described herein, the combinations of hardware and programming may be implemented in a number of different ways. For example, the programming for the elements may be processor executable instructions stored on a non-transitory machine-readable storage medium and the hardware for the elements may include a processing resource to execute those instructions. In these examples, a computing device implementing such elements may include the machine-readable storage medium storing the instructions and the processing resource to execute the instructions, or the machine-readable storage medium may be separately stored and accessible by the computing device and the processing resource. In some examples, some elements may be implemented in circuitry.

FIG. 1 illustrates an architectural layout of a signal leakage monitoring based quality control system (hereinafter also referred to as "system 100") in accordance with an example of the present disclosure.

Referring to FIG. 1, the system 100 may include a signal leakage level detector 102 that is executed by at least one hardware processor (e.g., the hardware processor 402 of FIG. 4, and/or the hardware processor 604 of FIG. 6), to measure, for a signal leak 104 at a specified location 106, a signal leakage level 108. The signal leak 104 may include a status 110 of being open. Examples of different types of signal leaks that may be addressed by the system 100 may include broken or cracked coaxial shielding, loose connections, misaligned or inadequate radio frequency (RF) seals on cable television (CATV) devices, RF interference with Long-Term Evolution (LTE), broadcast television, frequency modulation (FM) and other off-air signals, as well as increased noise/interference in the upstream communication path.

According to examples, the signal leakage level detector 102 may be implemented in a leakage receiver 112.

The signal leakage level detector 102 may assign, to the signal leakage level 108, a geo-location value 114 associated with the measurement of the signal leakage level 108. The geo-location value 114 may represent a physical location where a technician operates the leakage receiver 112 to measure the signal leak 104. That is, the geo-location value 114 may represent a physical location that a technician believes that they are relative to the signal leak 104, compared to where the signal leak 104 is actually located at. The geo-location value 114 may be determined by using various techniques such as triangulation, Global Positioning System (GPS), etc.

Further, the signal leakage level detector 102 may assign, to the signal leakage level 108, a time value 116 associated with the measurement of the signal leakage level 108. An example of the time value 116 may be provided in a day/month/year format, with a time of measurement of the signal leakage level 108.

With respect to the signal leakage level 108, metadata associated with the signal leakage level 108 may include the geo-location value 114, and the time value 116, and other metadata such as measured frequency associated with the signal leak 104, and other such details associated with the signal leakage level 108.

A signal leakage closure quality analyzer 118 that is executed by at least one hardware processor (e.g., the hardware processor 402 of FIG. 4, and/or the hardware processor 604 of FIG. 6) may transmit the signal leakage level 108, the geo-location value 114, and the time value 116 to a signal leakage analyzer 120. Further, the signal leakage closure quality analyzer 118 may receive, from the signal leakage analyzer 120 and based on an analysis of the signal leakage level 108, the geo-location value 114, and the time value 116 by the signal leakage analyzer 120, an indication that the status 110 of the signal leak 104 is changed from being open to closed, or the status 110 of the signal leak 104 remains open.

Figure 2:
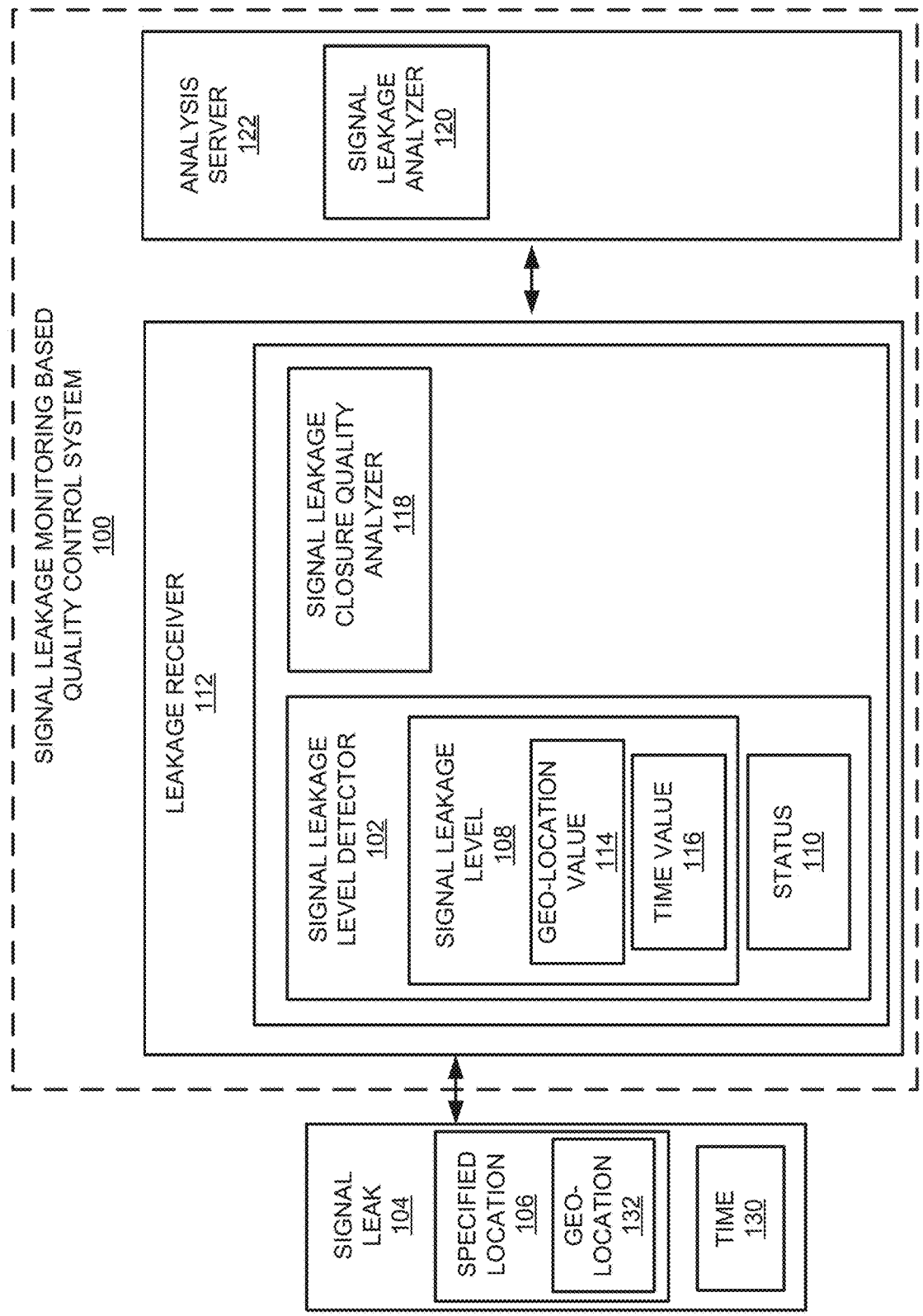
FIG. 2 illustrates another architectural layout of the signal leakage monitoring based quality control system of FIG. 1 in accordance with an example of the present disclosure.
Figure 3:
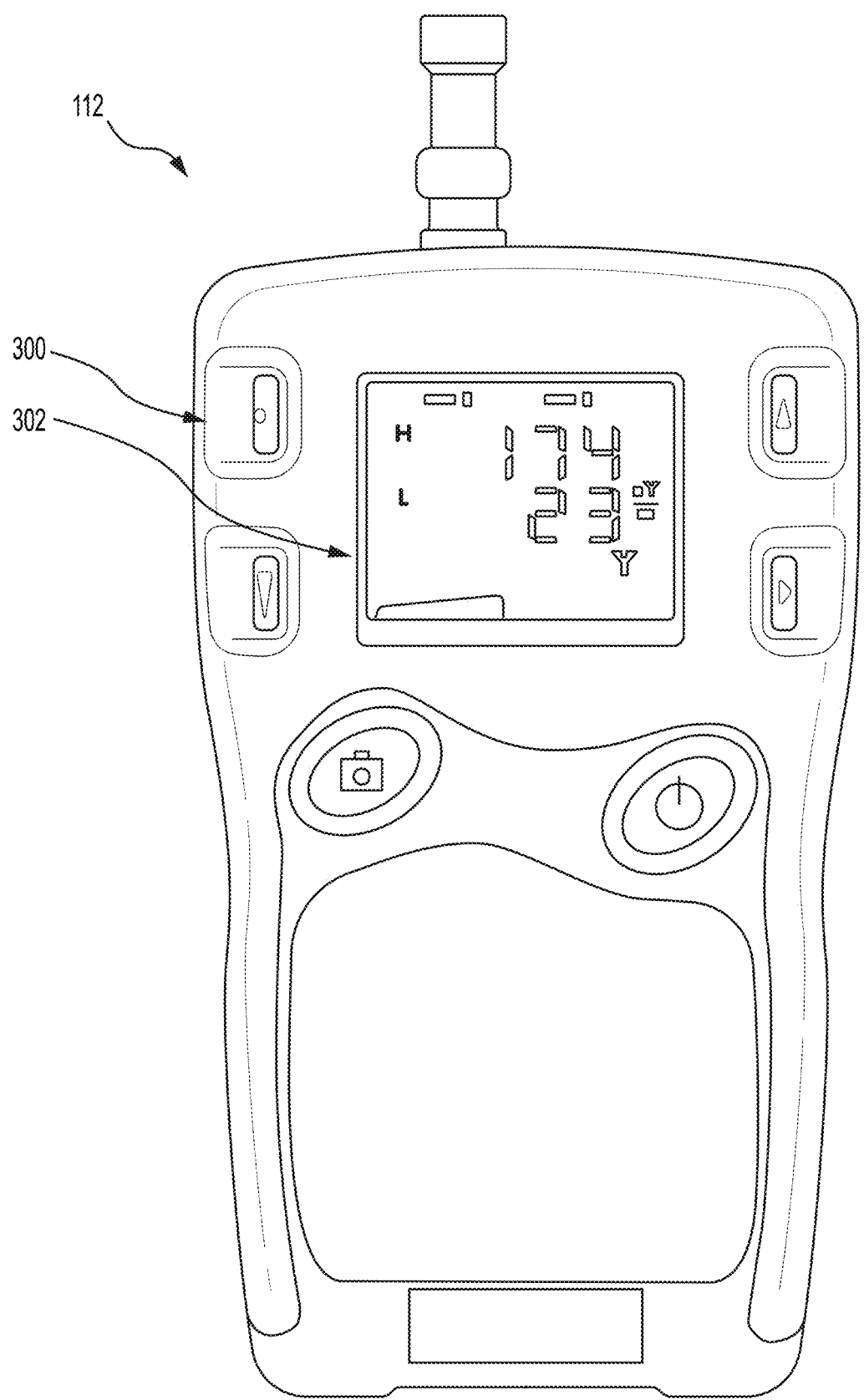
FIG. 3 illustrates an example of a leakage receiver of the signal leakage monitoring based quality control system of FIG. 1 in accordance with an example of the present disclosure.

According to examples, as shown in FIG. 1, the signal leakage analyzer 120 may be implemented as a component of a leakage receiver 112 (e.g., see FIG. 3). Alternatively, as shown in FIG. 2, the signal leakage analyzer 120 may be implemented in an analysis server 122, a cloud environment, or another such environment, where the signal leakage level 108, the geo-location value 114, and the time value 116 may be analyzed as disclosed herein, and results of the analysis may be communicated (e.g., wirelessly, or otherwise) to the leakage receiver 112.

According to examples, the status 110 of the signal leak 104 may be changed from being open to closed based on a determination, by the signal leakage analyzer 120, that the signal leakage level 108 is less than or equal to a specified signal leakage threshold 124. For example, the specified signal leakage threshold 124 may be set at 17 $\mu$V/m, or another such value.

According to examples, the status 110 of the signal leak 104 may be specified to remain open based on a determination, by the signal leakage analyzer 120, that the signal leakage level 108 is greater than the specified signal leakage threshold 124.

According to examples, the signal leakage closure quality analyzer 118 may generate, based on the indication that the status 110 of the signal leak 104 remains open, another indication to service the signal leak 104.

According to examples, the signal leakage closure quality analyzer 118 may receive, from the signal leakage analyzer 120 and based on a determination by the signal leakage analyzer 120 that the geo-location value 114 corresponds to a distance from the signal leak 104 that is less than or equal to a specified distance 126 for the signal leak 104, another indication that the signal leakage level 108 is associated with the signal leak 104. For example, the geo-location value 114 may correspond to a distance of 5 feet from the signal leak 104, and the specified distance 126 may be set at 10 feet for the signal leak 104, in which case the signal leakage level 108 may be designated as being associated with the signal leak 104.

According to examples, the signal leakage analyzer 120 may utilize a relatively higher specified distance 126 for the signal leak 104 above a specified signal leak threshold 128, and a relatively lower specified distance 126 for the signal leak 104 below the specified signal leak threshold 128. For example, for the signal leak 104 (e.g., at level 200 $\mu$V/m) above a specified signal leak threshold 128 of 50 $\mu$V/m, the specified distance 126 may be set at 400 feet, whereas for the signal leak 104 (e.g., at level 20 $\mu$V/m) below the specified signal leak threshold 128 of 50 $\mu$V/m, the specified distance 126 may be set at 80 feet. Thus, the specified distance 126 may be designated as a configurable distance that may be determined based on a linear, a non-linear, or another type of relationship with respect to the level associated with the signal leak 104.

According to examples, the signal leakage closure quality analyzer 118 may receive, from the signal leakage analyzer 120 and based on a determination by the signal leakage analyzer 120 that the geo-location value 114 corresponds to a distance from the signal leak that is greater than the specified distance 126 for the signal leak 104, another indication that the signal leakage level 108 is not associated with the signal leak 104.

According to examples, the signal leakage closure quality analyzer 118 may receive, from the signal leakage analyzer 120 and based on a determination by the signal leakage analyzer 120 that the time value 116 is after a time 130 associated with the signal leak 104, another indication that the signal leakage level 108 is associated with the signal leak 104. For example, if the time value 116 of 10:00 AM, Mar. 1, 2020 is after a time 130 of 12:00 PM, Feb. 1, 2020 associated with the signal leak 104, the signal leakage level 108 may be designated as being associated with the signal leak 104.

According to examples, the signal leakage closure quality analyzer 118 may receive, from the signal leakage analyzer 120 and based on a determination by the signal leakage analyzer 120 that the time value 116 is before the time 130 associated with the signal leak 104, another indication that the signal leakage level 108 is not associated with the signal leak 104. For example, if the time value 116 of 10:00 AM, Feb. 1, 2020 is before a time 130 of 12:00 PM, Mar. 1, 2020 associated with the signal leak 104, the signal leakage level 108 may be designated as not being associated with the signal leak 104 (e.g., since a signal leak 104 that occurs at a later time cannot be addressed prior to the occurrence thereof).

According to examples, the signal leakage closure quality analyzer 118 may receive, from the signal leakage analyzer 120 and based on an analysis of the geo-location value 114 associated with the measurement of the signal leakage level 108 relative to a geo-location 132 associated with the signal leak 104, another indication of a recommended direction of movement 134 towards the signal leak 104. For example, based on comparison of the geo-location value 114 to the geo-location 132, a technician performing remedial actions with respect to the signal leak 104 may be directed to move left, right, or in another direction towards the signal leak 104 from the current position of the technician as specified by the geo-location value 114.

With respect to the signal leak 104, metadata associated with the signal leak 104 may include the geo-location 132, and other metadata such as a time (e.g., time of detection), frequency, and other such details associated with the signal leak 104. This metadata for the signal leak 104 may be compared to the metadata for the signal leakage level 108 as disclosed herein to determine whether to close the signal leak 104, or whether to maintain the signal leak 104 in an open status.

As disclosed herein, as shown in FIG. 1, the signal leakage analyzer 120 may be implemented as a component of the leakage receiver 112 (e.g., see FIG. 3). Alternatively, as shown in FIG. 2, the signal leakage analyzer 120 may be implemented in the analysis server 122, a cloud environment, or another such environment, where the signal leakage level 108, the geo-location value 114, and the time value 116 may be analyzed as disclosed herein, and results of the analysis may be communicated (e.g., wirelessly, or otherwise) to the leakage receiver 112.

In this regard, according to examples, the signal leakage analyzer 120 may receive, from the signal leakage closure quality analyzer 118, a signal leakage level 108, a geo-location value 114, and a time value 116. The signal leakage level 108 may be measured by the signal leakage level detector 102 and for a signal leak 104 at a specified location 106. The signal leak may include a status 110 of being open. The geo-location value 114 may be assigned to the signal leakage level 108, and may be associated with the measurement of the signal leakage level 108. The time value 116 may be assigned to the signal leakage level 108, and may be associated with the measurement of the signal leakage level 108. The signal leakage analyzer 120 may transmit, to the signal leakage closure quality analyzer 118, based on an analysis of the signal leakage level 108, the geo-location value 114, and the time value 116, an indication that the status of the signal leak 104 is changed from being open to closed, or the status of the signal leak 104 is maintained as open.

According to examples, the signal leakage analyzer 120 may generate the indication to change the status 110 of the signal leak 104 from being open to closed based on a determination that the signal leakage level 108 is less than or equal to a specified signal leakage threshold 124.

According to examples, the signal leakage analyzer 120 may generate the indication to maintain the status 110 of the signal leak 104 as open based on a determination that the signal leakage level 108 is greater than the specified signal leakage threshold 124.

According to examples, the leakage receiver 112 may also apply a quadrangulation technique to determine the geo-location 132 for the signal leak 104. In this regard, the quadrangulation technique may utilize multiple points of observation (e.g., up to four), and create a localized heat map to determine the geo-location 132 for the signal leak 104 from the four observation points that are separate from each other. An example of the quadrangulation technique is disclosed in U.S. Pat. No. 9,021,539, titled "Leakage location methods", the disclosure of which is incorporated by reference in its entirety. Thus, based on the utilization of the quadrangulation technique to determine the geo-location 132 for the signal leak 104, accuracy of the overall functionality of the system 100 may be increased to determine the signal leak 104, as well as to remedy the signal leak 104.

FIG. 3 illustrates an example of the leakage receiver 112 of the system 100 in accordance with an example of the present disclosure.

Referring to FIG. 3, the leakage receiver 112 may include a button 300 to initiate measurement of the signal leakage level 108, and to further transmit the signal leakage level 108, the geo-location value 114, and the time value 116 to the signal leakage analyzer 120. The status 110 of the signal leak 104 to remain open or to be changed from being open to closed may be displayed on the display 302.

Figure 4:
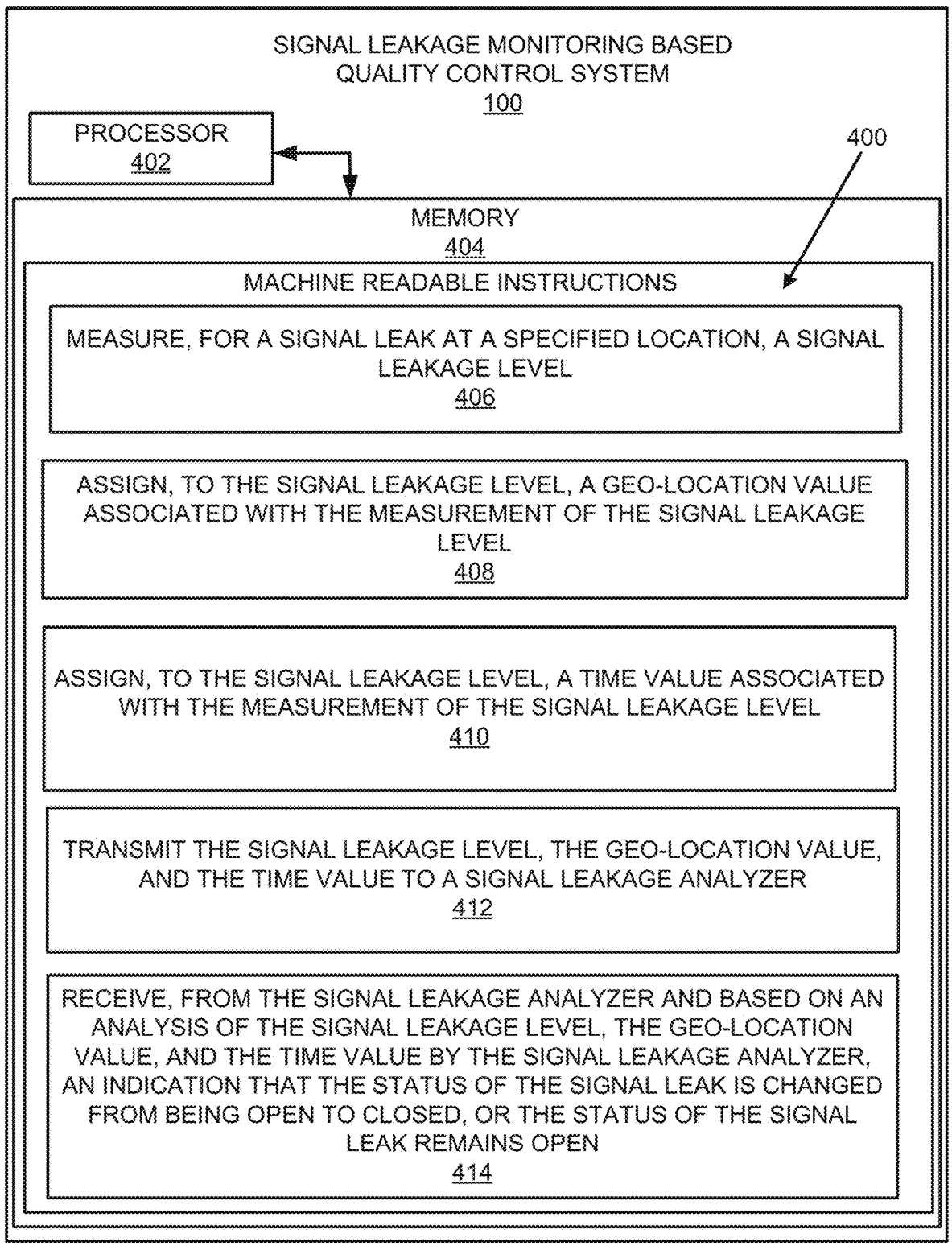
FIG. 4 illustrates an example block diagram for signal leakage monitoring based quality control in accordance with an example of the present disclosure.
Figure 6:
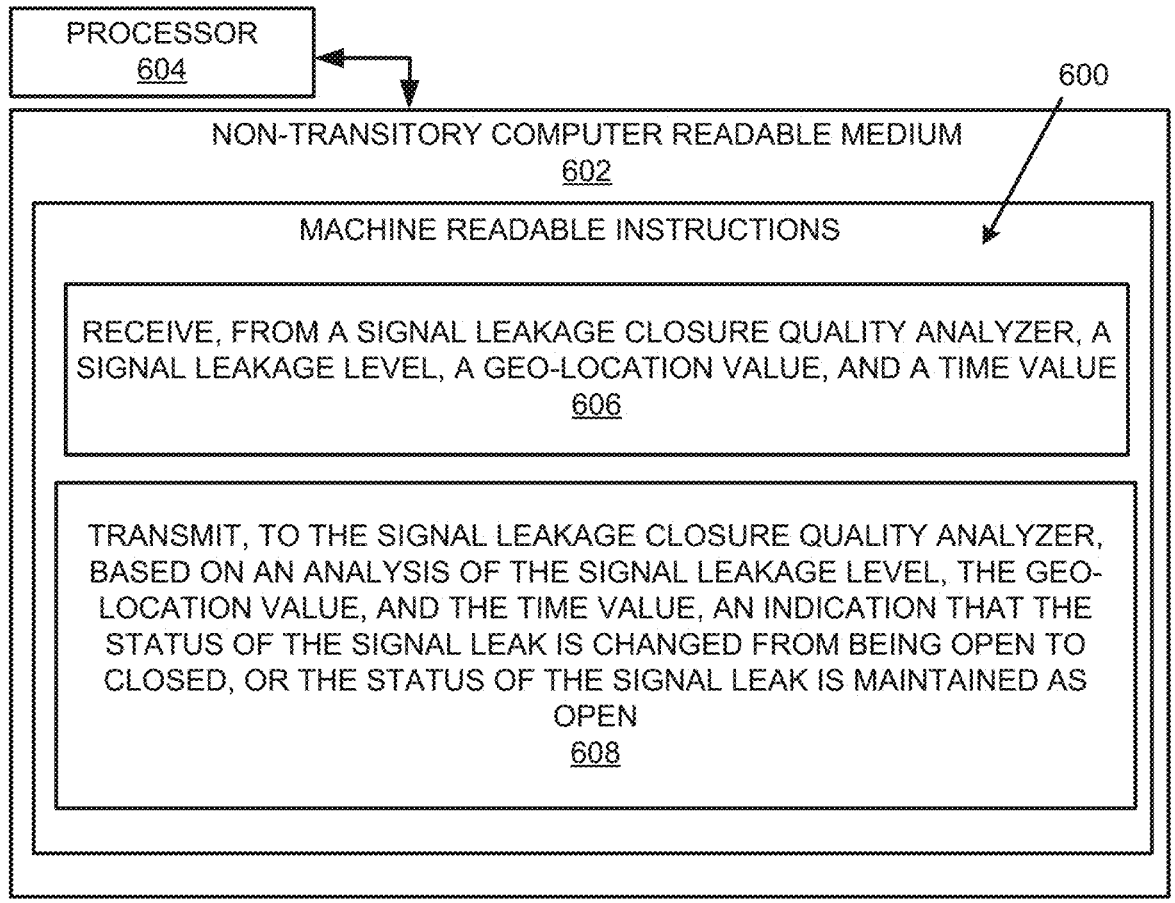
FIG. 6 illustrates a further example block diagram for signal leakage monitoring based quality control in accordance with another example of the present disclosure.

FIGS. 4-6 respectively illustrate an example block diagram 400, a flowchart of an example method 500, and a further example block diagram 600 for signal leakage monitoring based quality control, according to examples. The block diagram 400, the method 500, and the block diagram 600 may be implemented on the system 100 described above with reference to FIG. 1 by way of example and not of limitation. The block diagram 400, the method 500, and the block diagram 600 may be practiced in other systems. In addition to showing the block diagram 400, FIG. 4 shows hardware of the system 100 that may execute the instructions of the block diagram 400. The hardware may include a processor 402, and a memory 404 storing machine readable instructions that when executed by the processor cause the processor to perform the instructions of the block diagram 400. The memory 404 may represent a non-transitory computer readable medium. FIG. 5 may represent an example method for signal leakage monitoring based quality control, and the steps of the method. FIG. 6 may represent a non-transitory computer readable medium 602 having stored thereon machine readable instructions to provide signal leakage monitoring based quality control according to an example. The machine readable instructions, when executed, cause a processor 604 to perform the instructions of the block diagram 600 also shown in FIG. 6.

The processor 402 of FIG. 4 and/or the processor 604 of FIG. 6 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 602 of FIG. 6), such as hardware storage devices (e.g., RAM (random access memory), ROM (read only memory), EPROM (erasable, programmable ROM), EEPROM (electrically erasable, programmable ROM), hard drives, and flash memory). The memory 404 may include a RAM, where the machine readable instructions and data for a processor may reside during runtime.

Referring to FIGS. 1-4, and particularly to the block diagram 400 shown in FIG. 4, the memory 404 may include instructions 406 to measure, for a signal leak 104 at a specified location 106, a signal leakage level 108. The signal leak 104 may include a status 110 of being open.

The processor 402 may fetch, decode, and execute the instructions 408 to assign, to the signal leakage level 108, a geo-location value 114 associated with the measurement of the signal leakage level 108.

The processor 402 may fetch, decode, and execute the instructions 410 to assign, to the signal leakage level 108, a time value 116 associated with the measurement of the signal leakage level 108.

The processor 402 may fetch, decode, and execute the instructions 412 to transmit the signal leakage level 108, the geo-location value 114, and the time value 116 to a signal leakage analyzer 120.

The processor 402 may fetch, decode, and execute the instructions 414 to receive, from the signal leakage analyzer 120 and based on an analysis of the signal leakage level 108, the geo-location value 114, and the time value 116 by the signal leakage analyzer 120, an indication that the status 110 of the signal leak 104 is changed from being open to closed, or the status 110 of the signal leak 104 remains open.

Referring to FIGS. 1-3 and 5, and particularly FIG. 5, for the method 500, at block 502, the method may include measuring, by a signal leakage level detector 102, for a signal leak 104 at a specified location 106, a signal leakage level 108. The signal leak 104 may include a specified status 110.

At block 504, the method may include transmitting, by the signal leakage level detector 102, the signal leakage level 108 to a signal leakage analyzer 120.

At block 506, the method may include receiving, from the signal leakage analyzer 120 and based on an analysis of the signal leakage level 108 by the signal leakage analyzer 120, an indication to maintain or change the specified status 110 of the signal leak 104.

According to examples, the method may include assigning, by the signal leakage level detector 102, to the signal leakage level 108, a geo-location value 114 associated with the measurement of the signal leakage level 108. The method may include assigning, by the signal leakage level detector 102, to the signal leakage level 108, a time value 116 associated with the measurement of the signal leakage level 108. The method may include transmitting, by the signal leakage level detector 102, the signal leakage level 108, the geo-location value 114, and the time value 116 to the signal leakage analyzer 120. Further, the method may include receiving, from the signal leakage analyzer 120 and based on the analysis of the signal leakage level 108, the geo-location value, and the time value 116 by the signal leakage analyzer 120, the indication to maintain or change the specified status 110 of the signal leak 104.

According to examples, for the method 500, receiving, from the signal leakage analyzer 120 and based on the analysis of the signal leakage level 108, the geo-location value 114, and the time value 116 by the signal leakage analyzer 120, the indication to maintain or change the specified status 110 of the signal leak 104, may further include receiving the indication to change the status 110 of the signal leak 104 from being open to closed, or receiving the indication to maintain the status 110 of the signal leak 104 as open.

According to examples, for the method 500, receiving the indication to change the status 110 of the signal leak 104 from being open to closed, may further include receiving the indication to change the status 110 of the signal leak 104 from being open to closed based on a determination, by the signal leakage analyzer 120, that the signal leakage level 108 is less than or equal to a specified signal leakage threshold 124.

According to examples, for the method 500, receiving the indication to maintain the status 110 of the signal leak 104 as open, may further include receiving the indication to maintain the status 110 of the signal leak 104 as open based on a determination, by the signal leakage analyzer 120, that the signal leakage level 108 is greater than a specified signal leakage threshold 124.

According to examples, the method may include receiving, from the signal leakage analyzer 120 and based on a determination by the signal leakage analyzer 120 that the geo-location value 114 corresponds to a distance from the signal leak 104 that is less than or equal to a specified distance 126 for the signal leak 104, another indication that the signal leakage level 108 is associated with the signal leak 104.

According to examples, the method may include receiving, from the signal leakage analyzer 120 and based on a determination by the signal leakage analyzer 120 that the geo-location value 114 corresponds to a distance from the signal leak 104 that is greater than a specified distance 126 for the signal leak 104, another indication that the signal leakage level 108 is not associated with the signal leak 104.

Referring to FIGS. 1-3 and 6, and particularly FIG. 6, for the block diagram 600, the non-transitory computer readable medium 602 may include instructions 606 to receive (e.g., by the signal leakage analyzer 120), from a signal leakage closure quality analyzer 118, a signal leakage level 108, a geo-location value 114, and a time value 116. In this regard, the signal leakage level 108 may be measured by a signal leakage level detector 102 and for a signal leak 104 at a specified location 106. The signal leak 104 may include a status 110 of being open. The geo-location value 114 may be assigned to the signal leakage level 108, and may be associated with the measurement of the signal leakage level 108. Further, the time value 116 may be assigned to the signal leakage level 108, and may be associated with the measurement of the signal leakage level 108.

The processor 604 may fetch, decode, and execute the instructions 608 to transmit, to the signal leakage closure quality analyzer 118, based on an analysis of the signal leakage level 108, the geo-location value 114, and the time value 116, an indication that the status 110 of the signal leak 104 is changed from being open to closed, or the status 110 of the signal leak 104 is maintained as open.

According to examples, the signal leakage analyzer 120 may generate the indication to change the status 110 of the signal leak 104 from being open to closed based on a determination that the signal leakage level 108 is less than or equal to a specified signal leakage threshold 124.

According to examples, the signal leakage analyzer 120 may generate the indication to maintain the status 110 of the signal leak 104 as open based on a determination that the signal leakage level 108 is greater than a specified signal leakage threshold 124.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A system comprising:
   a signal leakage level detector, executed by at least one hardware processor, to
      measure, for a signal leak at a specified location in a network, a signal leakage level, wherein the signal leak includes a status of being open stored in a database,
      assign, to the signal leakage level, a geo-location value representing a physical location of the signal leakage level detector associated with the measurement of the signal leakage level, and
      assign, to the signal leakage level, a time value associated with a time of the measurement of the signal leakage level; and
   a signal leakage closure quality analyzer, executed by the at least one hardware processor, to
      transmit the signal leakage level, the geo-location value, and the time value associated with the measurement of the signal leakage level to a signal leakage analyzer, wherein the signal leakage analyzer compares the signal leakage level to a predetermined signal leakage threshold to determine whether the signal leak at the specified location in the network is considered an active leak and the status of the signal leak is maintained as being open, or the signal leak at the specified location in the network is considered an inactive leak and the status of the signal leak is to be changed from being open to closed,
      receive, from the signal leakage analyzer, one of a first indication that the signal leak is considered inactive and the status of the signal leak is to be changed from being open to closed based on a determination that the signal leakage level is less than or equal to the predetermined signal leakage threshold, or a second indication that the signal leak is considered active and the status of the signal leak is maintained as being open based on a determination that the signal leakage level is greater than the predetermined signal leakage threshold, and
      change the status of the signal leak in the database from being open to closed in response to receiving the first indication.

2. The system according to claim 1, wherein the signal leakage closure quality analyzer is executed by the at least one hardware processor to:
   determine whether the time value associated with the time of the measurement of the signal leakage level is after a time associated with the signal leak, wherein the time associated with the signal leak represents a time of detection of the signal leak, and
   based on a determination that the time value associated with the time of the measurement of the signal leakage level is after the time associated with the signal leak, generate an indication that the signal leakage level is designated as being associated with the signal leak.

3. The system according to claim 1, wherein the signal leakage closure quality analyzer is executed by the at least one hardware processor to:
   determine whether the time value associated with the time of the measurement of the signal leakage level is before a time associated with the signal leak, wherein the time associated with the signal leak represents a time of detection of the signal leak, and
   based on a determination that the time value associated with the time of the measurement of the signal leakage level is before the time associated with the signal leak, generate an indication that the signal leakage level is designated as not being associated with the signal leak.

4. The system according to claim 1, wherein the signal leakage closure quality analyzer is executed by the at least one hardware processor to:
   generate, based on the second indication that the signal leak is considered active and the status of the signal leak is maintained as being open, another indication that the signal leak at the specified location is to be serviced.

5. The system according to claim 1, wherein the signal leakage closure quality analyzer is executed by the at least one hardware processor to:
   receive, from the signal leakage analyzer and based on a determination by the signal leakage analyzer that the geo-location value corresponds to a distance from the signal leak that is less than or equal to a specified distance for the signal leak, another indication that the signal leakage level is designated as being associated with the signal leak.

6. The system according to claim 5, wherein the signal leakage analyzer is to utilize a relatively higher specified distance when the signal leakage level is above the predetermined signal leakage threshold, and a relatively lower specified distance when the signal leakage level is below the predetermined signal leak threshold.

7. The system according to claim 1, wherein the signal leakage closure quality analyzer is executed by the at least one hardware processor to:
   receive, from the signal leakage analyzer and based on a determination by the signal leakage analyzer that the geo-location value corresponds to a distance from the signal leak that is greater than a specified distance for the signal leak, another indication that the signal leakage level is designated as not being associated with the signal leak at the specified location.

8. The system according to claim 1, wherein the signal leakage closure quality analyzer is executed by the at least one hardware processor to:
   receive, from the signal leakage analyzer and based on an analysis of the geo-location value representing the physical location of the signal leakage level detector associated with the measurement of the signal leakage level relative to a geo-location associated with the signal leak at the specified location in the network, another indication of a recommended direction of movement towards the signal leak.

9. A system comprising:
a signal leakage analyzer, executed by at least one hardware processor, to
receive, from a signal leakage closure quality analyzer, a signal leakage level, a geo-location value, and a time value, wherein
the signal leakage level is measured by a signal leakage level detector for a signal leak at a specified location in a network, wherein the signal leak includes a status of being open stored in a database,
the geo-location value represents a physical location of the signal leakage level detector associated with the measurement of the signal leakage level, and
the time value is associated with a time of the measurement of the signal leakage level;
compare the signal leakage level to a predetermined signal leakage threshold to determine whether the signal leak at the specified location in the network is considered an active leak and the status of the signal leak is maintained as being open, or the signal leak at the specified location in the network is considered an inactive leak and the status of the signal leak is to be changed from being open to closed; and
transmit, to the signal leakage closure quality analyzer, one of a first indication that the signal leak is considered inactive and the status of the signal leak is to be changed from being open to closed based on a determination that the signal leakage level is less than or equal to the predetermined signal leakage threshold, or a second indication that the signal leak is considered active and the status of the signal leak is maintained as being open based on a determination that the signal leakage level is greater than the predetermined signal leakage threshold,
wherein the transmission of the first indication causes the signal leakage closure quality analyzer to change the status of the signal leak in the database from being open to closed.

10. The system according to claim 9, wherein the signal leakage analyzer is executed by at least one hardware processor to:
determine whether the time value associated with the time of the measurement of the signal leakage level is after a time associated with the signal leak, wherein the time associated with the signal leak represents a time of detection of the signal leak, and
based on a determination that the time value associated with the time of the measurement of the signal leakage level is after the time associated with the signal leak, generate an indication that the signal leakage level is designated as being associated with the signal leak.

11. The system according to claim 9, wherein the signal leakage analyzer is executed by at least one hardware processor to:
determine whether the time value associated with the time of the measurement of the signal leakage level is before a time associated with the signal leak, wherein the time associated with the signal leak represents a time of detection of the signal leak, and
based on a determination that the time value associated with the time of the measurement of the signal leakage level is before the time associated with the signal leak, generate an indication that the signal leakage level is designated as not being associated with the signal leak.

12. A method comprising:
measuring, by a signal leakage level detector, a signal leakage level for a signal leak at a specified location in a network, wherein the signal leak includes a status of being open stored in a database;
transmitting, by the signal leakage level detector, the signal leakage level to a signal leakage analyzer, wherein the signal leakage analyzer compares the signal leakage level to a predetermined signal leakage threshold to determine whether the signal leak at the specified location is considered an active leak and the status of the signal leak is maintained as being open, or the signal leak at the specified location is considered an inactive leak and the status of the signal leak is to be changed from being open to closed;
receiving, from the signal leakage analyzer, one of a first indication that the signal leak is considered inactive and the status of the signal leak is to be changed from being open to closed based on a determination that the signal leakage level is less than or equal to the predetermined signal leakage threshold, or a second indication that the signal leak is considered active and the status of the signal leak is maintained as being open based on a determination that the signal leakage level is greater than the predetermined signal leakage threshold; and
changing, by the signal leakage level detector, the status of the signal leak in the database from being open to closed in response to receiving the first indication.

13. The method according to claim 12, further comprising:
assigning, by the signal leakage level detector, to the signal leakage level, a geo-location value representing a physical location of the signal leakage level detector associated with the measurement of the signal leakage level;
assigning, by the signal leakage level detector, to the signal leakage level, a time value associated with a time of the measurement of the signal leakage level; and
transmitting, by the signal leakage level detector, the signal leakage level, the geo-location value, and the time value to the signal leakage analyzer,
wherein the signal leakage analyzer is to determine whether the time value associated with the time of the measurement of the signal leakage level is after or before a time of detection of the signal leak in order to determine whether the signal leakage level is to be designated as being associated or not being associated with the signal leak.

14. The method according to claim 13, further comprising one of:
receiving, from the signal leakage analyzer and based on a determination that the time value associated with the time of the measurement of the signal leakage level is after the time of detection of the signal leak, an indication that the signal leakage level is designated as being associated with the signal leak; or
receiving, from the signal leakage analyzer and based on a determination that the time value associated with the time of the measurement of the signal leakage level is before the time of detection of the signal leak, an indication that the signal leakage level is designated as not being associated with the signal leak.

15. The method according to claim 13, further comprising:
 receiving, from the signal leakage analyzer and based on an analysis of the geo-location value representing the physical location of the signal leakage level detector associated with the measurement of the signal leakage level relative to a geo-location associated with the signal leak, another indication of a recommended direction of movement towards the signal leak.

16. The method according to claim 13, further comprising:
 receiving, from the signal leakage analyzer and based on a determination by the signal leakage analyzer that the geo-location value corresponds to a distance from the signal leak that is less than or equal to a specified distance for the signal leak, another indication that the signal leakage level is designated as being associated with the signal leak.

17. The method according to claim 13, further comprising:
 receiving, from the signal leakage analyzer and based on a determination by the signal leakage analyzer that the geo-location value corresponds to a distance from the signal leak that is greater than a specified distance for the signal leak, another indication that the signal leakage level is designated as not being associated with the signal leak.

18. The method according to claim 12, further comprising:
 based on the second indication that the signal leak is considered active and the status of the signal leak is maintained as being open, generate another indication for the signal leak at the specified location to be serviced.

* * * * *